United States Patent
Weng

(10) Patent No.: US 6,867,122 B2
(45) Date of Patent: Mar. 15, 2005

(54) REDISTRIBUTION PROCESS

(75) Inventor: Chao-Fu Weng, Tainan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 249 days.

(21) Appl. No.: 10/248,293

(22) Filed: Jan. 6, 2003

(65) Prior Publication Data
US 2003/0129541 A1 Jul. 10, 2003

(30) Foreign Application Priority Data
Jan. 7, 2002 (TW) .......................... 91100099 A

(51) Int. Cl.⁷ .............................................. H01L 21/44
(52) U.S. Cl. ...................... 438/614; 438/613; 438/612; 438/691
(58) Field of Search ................................ 438/612–614, 438/691

(56) References Cited
U.S. PATENT DOCUMENTS
6,455,408 B1 * 9/2002 Hwang et al. .............. 438/613
* cited by examiner Primary Examiner—Luan Thai
(74) Attorney, Agent, or Firm—Jiang Chyun IP Office

(57) ABSTRACT

A redistribution process is described. A wafer is provided, wherein a first titanium layer, a first copper layer and a second titanium are sequentially formed over the surface of the wafer. The second titanium layer, the first copper layer and the first titanium layer are then defined to form a patterned trace layer. A patterned benzocyclobutene layer is then formed to expose the second titanium layer. The exposed second titanium layer is further removed to expose the first copper layer. Thereafter, a plurality of contacts is formed over the patterned benzocyclobutene layer and to connect with the first copper layer. Further, the wafer comprises a plurality of bonding pads, wherein each bonding pad is connected with each contact through the patterned trace layer.

10 Claims, 9 Drawing Sheets

REDISTRIBUTION PROCESS

CROSS REFERENCE TO RELATED APPLICATIONS

This application claims the priority benefit of Taiwan application serial no. 91100099, filed on Jan. 7, 2002.

BACKGROUND OF INVENTION

1. Field of Invention

The present invention relates to a redistribution process. More particularly, the present invention relates to a redistribution process using benzocyclobutene for the dielectric layer.

2. Description of Related Art

A redistribution process basically redistributes the Contacts (usually conductive bonding pads) on a wafer to a new pattern using a redistributed trace layer. Normally, in a flip-chip attachment, the periphery I/O bonding pads are redistributed to an area array pattern. Further, the redistributed Contacts are terminated with solder bumps for external connection. Besides forming bumps on the above Contacts, the redistributed Contacts can also be terminated with bonding pads.

In a conventional redistribution process, copper is typically used for the connective traces and the dielectric layer is formed with polyimide or benzocyclobutene. However, the binding between benzocyclobutene and copper is poor when benzocyclo-butene is used as the dielectric layer. Therefore, when a benzocyclobutene layer is formed over a copper trace layer, the peeling of benzocyclobutene during the development process is resulted, adversely affecting the manufacturing process.

The conventional redistribution process is illustrated in FIGS. 1 to 7, wherein FIGS. 1 to 7 are schematic top views of the process flow for a wafer redistribution process.

As shown in FIG. 1, a wafer 100 comprising a plurality of bonding pads 102 is provided. A protection layer 104 that is disposed over the wafer 100 and exposes the bonding pads 102 is also formed over the wafer 100. A titanium layer 106 and a copper layer 108 are sequentially formed over the wafer 100 surface. As shown in FIG. 2, a patterned photoresist layer 112 is formed over the surface of the copper layer 108, wherein the patterned photoresist layer 112 comprises a plurality of openings 112a, which expose a part of the copper layer 108. Thereafter, a copper layer 109 is electroplated on the surface of the exposed copper layer 108.

Referring to FIG. 3, the patterned photoresist layer 112 is then removed. Further using the copper layer 109 as a mask, portions of the copper layer 108 and the titanium layer 106 are etched to form a patterned trace layer 150. As shown in FIG. 4, a patterned benzocyclobutene layer 114 is formed over the protection layer 104 and the patterned trace layer 150. This patterned benzocyclobutene layer 114 comprises a plurality of openings 114a, exposing the copper layer 109. A copper layer 116 is further formed over the surface of the patterned benzocyclobutene layer 114 and the exposed surface of the copper layer 109.

As shown in FIG. 5, a patterned photoresist layer 118 is formed over the surface of the copper layer 116. The patterned photoresist layer 118 comprises a plurality of openings 118a, which expose a portion of the copper layer 116. Using an electroplating method, a copper layer 120 and a tin-lead paste layer 122 are sequentially electroplated on the exposed surface of the copper layer 116. As shown in FIG. 6, the patterned photoresist layer 118 is etched. Further using the tin-lead paste material layer 122 as a mask, the exposed copper layer 1116 is removed. Thereafter, as in FIG. 7, a solder reflow process is performed to form the tin-lead paste material layer 122 into a bump 122a.

As discussed in the above, when benzocyclobutene is used for the dielectric layer, the binding between benzocyclobutene and copper is poor. Therefore, during the processing step shown in FIG. 4, a peeling of benzocyclobutene is resulted during the development process to pattern the benzocyclobutene layer 114 on the patterned trace layer 150. The manufacturing process is thereby adversely affected.

SUMMARY OF INVENTION

Accordingly, the present invention provides a redistribution process, wherein the binding between the patterned trace layer and benzocyclobutene is improved. As a result, during the development process, the peeling of benzocyclobutene is prevented when benzocyclobutene is used for the dielectric layer to maintain the yield of the manufacturing process.

In accordance to the present invention, a redistribution process is provided, wherein the process comprises providing a wafer. A first titanium layer, a first copper layer and a second titanium layer are sequentially formed on the surface of the wafer. The second titanium layer, the first copper layer and the first titanium layer are then patterned to form a patterned trace layer. A patterned benzocyclobutene layer is further formed, exposing the second titanium layer. Thereafter, the exposed second titanium layer is removed to expose the first copper layer. A plurality of Contacts is further formed over the patterned benzocyclobutene layer, connecting with the exposed first copper layer. The wafer comprises a plurality of bonding pads, wherein each Contact is connected to the bonding pad through the patterned trace layer.

According to the present invention, the patterned trace layer is formed with the first titanium layer, the first copper layer and the second titanium layer. Therefore, when the patterned benzocyclobutene layer is formed as the dielectric layer, the second titanium layer binds with the patterned benzocyclobutene layer. Since the binding between benzocyclobutene and a titanium material is better than the binding between benzocyclobutene and a copper material, the binding between the patterned trace layer and the patterned benzocyclobutene layer is more favorable, compared to the prior art. The yield of the process is thereby increased.

According to the present invention, after forming the patterned benzocyclobutene layer, a portion of the second titanium layer is removed to expose a part of the copper layer, connecting the second copper layer with the first copper layer of the patterned trace layer. Not only the binding between benzocyclobutene and titanium is improved, a favorable electrical connection in the connective traces is maintained.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

FIGS. 8 to 20 are schematic, cross-sectional views illustrating the process flow for a wafer redistribution process according to one aspect of the present invention.

Figure 1:
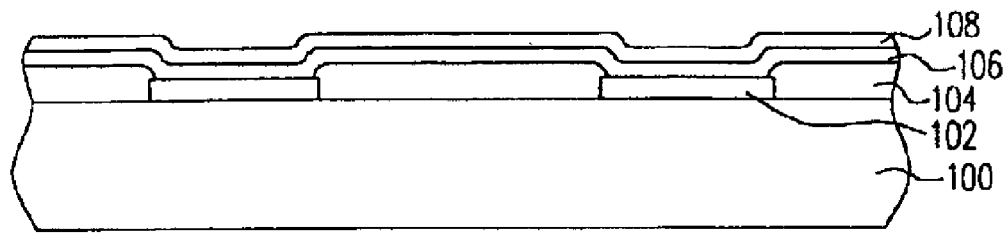
FIGS. 1 to 7 are schematic, cross-sectional views illustrating the process flow for a wafer redistribution process according to the prior art.
Figure 2:
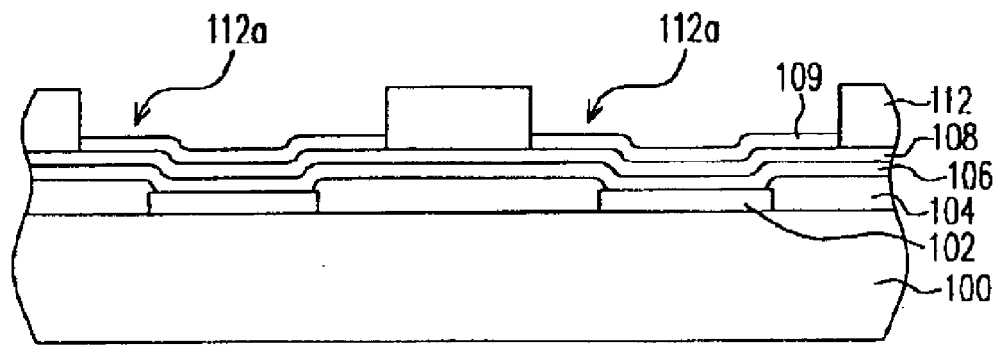
Figure 3:
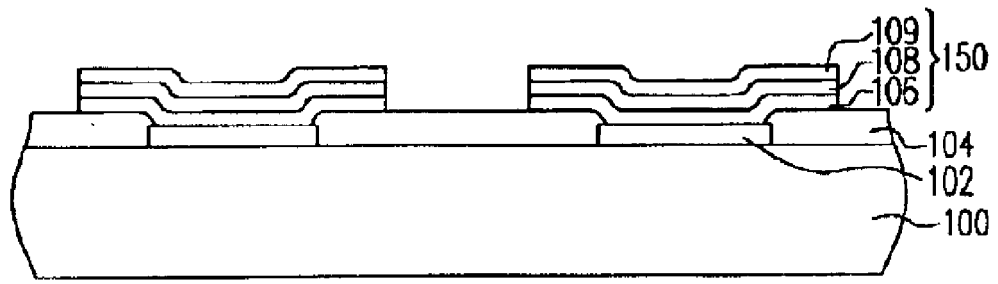
Figure 4:
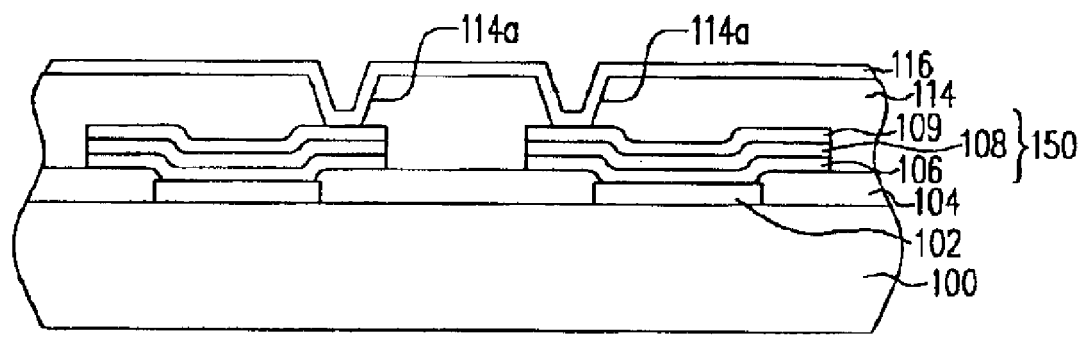
Figure 5:
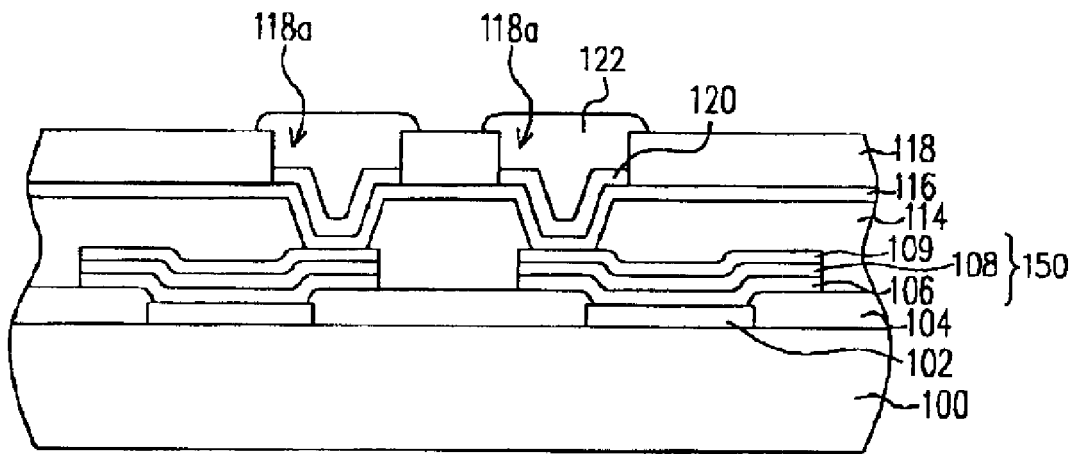
Figure 6:
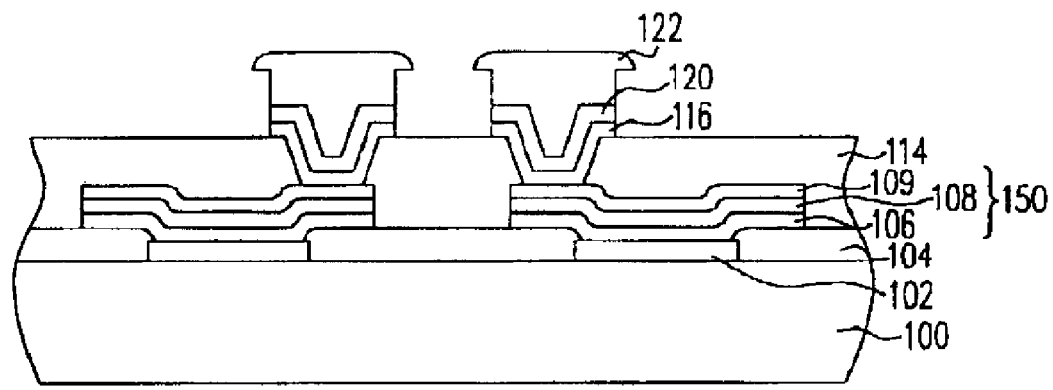
Figure 7:
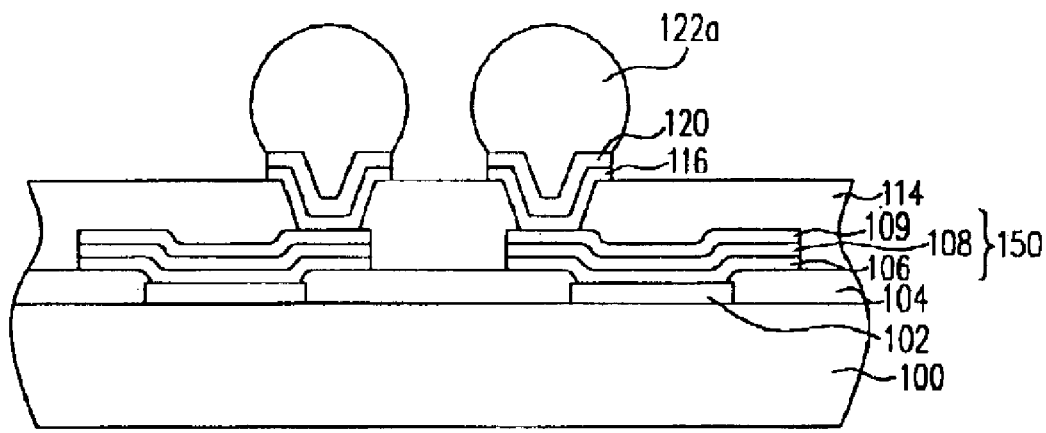
Figure 8:
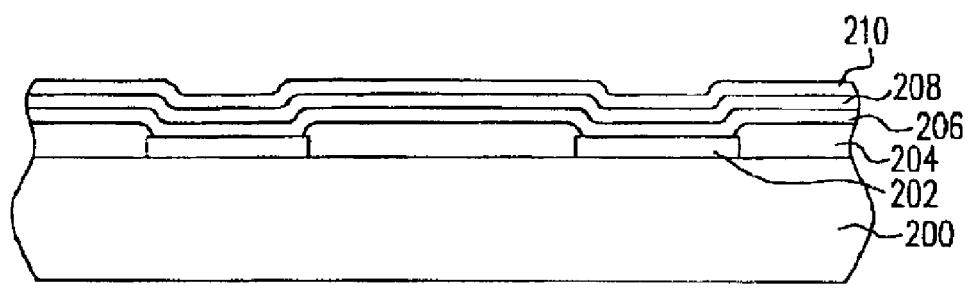
FIGS. 8 to 20 are schematic, cross-sectional views illustrating the process flow for a wafer redistribution process according to one aspect of the present invention.

As shown in FIG. 8, a wafer 200 having a plurality of bonding pads 202 is provided. A protection layer 204 over the wafer 200 surface and exposing the bonding pads is formed over the wafer 200. A titanium layer 206, a copper layer 208 and a titanium layer 210 are sequentially formed over the wafer 200 surface, wherein the protection layer 204 is formed with a material that comprises silicon dioxide or silicon nitride.

Figure 10:
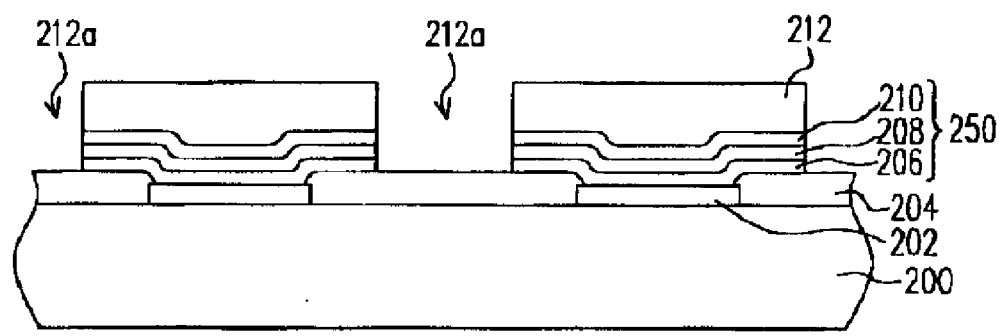
Figure 11:
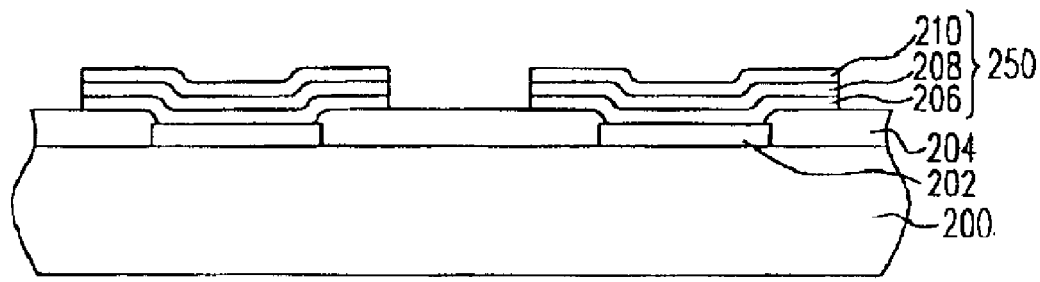

The titanium layer 210, the copper layer 208 and the first titanium layer 206 are then patterned to form a patterned trace layer 250 as in FIG. 11. The patterned trace layer 250 connects to each bonding pad 202 and exposes the protection layer 204. The titanium layer 210, the copper layer 208 and the titanium layer 206 are patterned as illustrated in FIGS. 9 to 11.

Figure 9:
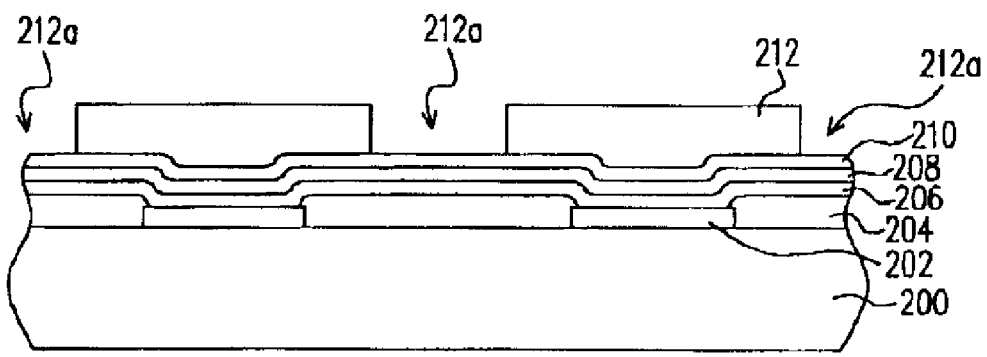

As shown in FIG. 9, a patterned photoresist layer 212 is formed over the surface of the titanium layer 210 by photolithography. The patterned photoresist layer 212 comprises a plurality of openings 212a, wherein the openings 212a expose the titanium layer 210. Referring to FIG. 10, the exposed titanium layer 210, the copper layer 208 and the titanium layer 206 are removed, followed by removing the patterned photoresist layer 212 as shown in FIG. 11.

Figure 12:
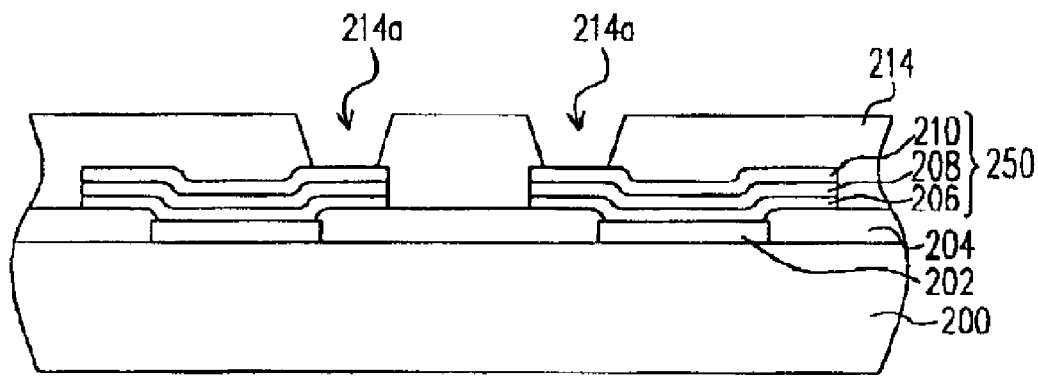
Figure 13:
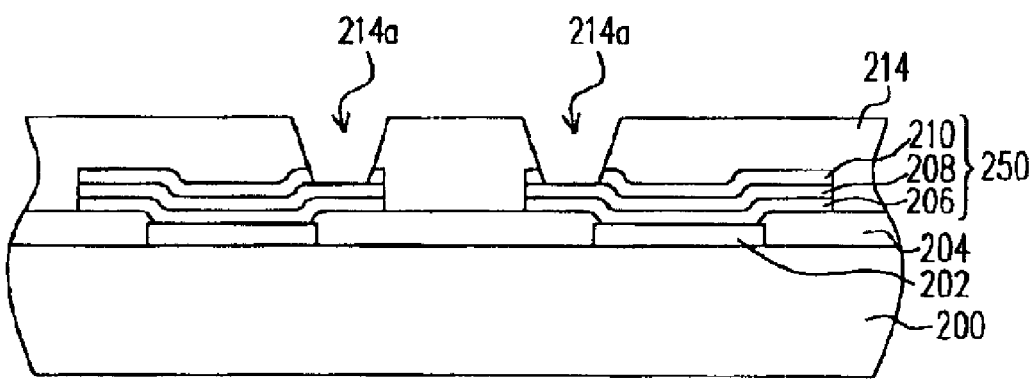

Continuing to FIG. 12, a patterned benzocyclobutene layer 214 is formed over the surface of the patterned trace layer 250 by photolithographing a photosensitive benzocyclobutene. The patterned benzocyclobutene layer 214 comprises a plurality of openings 214a, exposing the titanium layer 210. The exposed titanium layer 210 is etched to expose the copper layer 208 as illustrated in FIG. 13.

Figure 19:
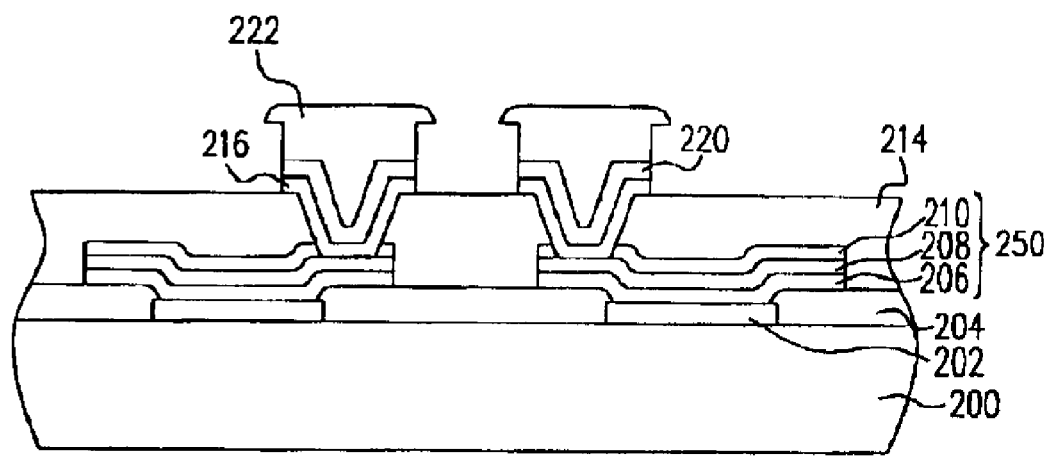
Figure 20:
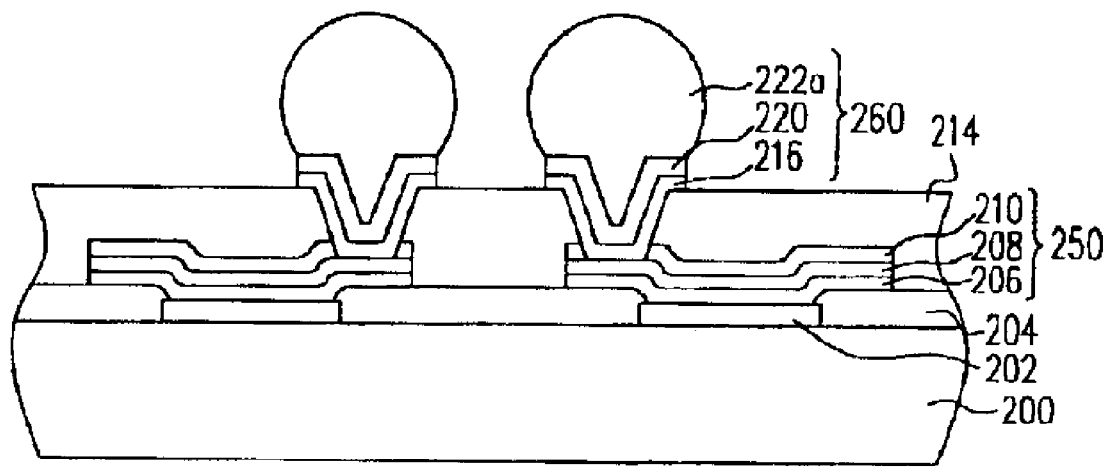

Thereafter, as shown in FIG. 20, a plurality of Contacts 260 are formed over the patterned benzocyclobutene layer 214 and to connect with the exposed copper layer 208. Each Contact 260 is connected to each bonding pad 202 through the patterned trace layer 250. The Contacts 260 are bonding pads or bumps. In this aspect of the present invention, bumps 222a are used for illustration. Forming the bumps 212a is illustrated in FIGS. 14 to 20.

Figure 14:
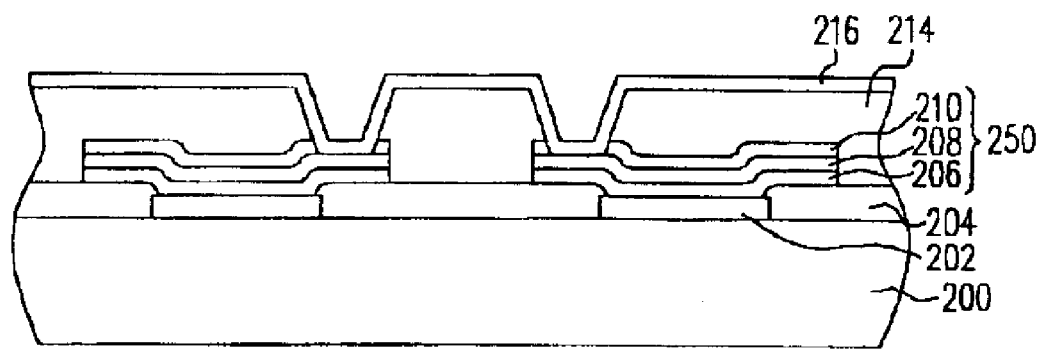
Figure 15:
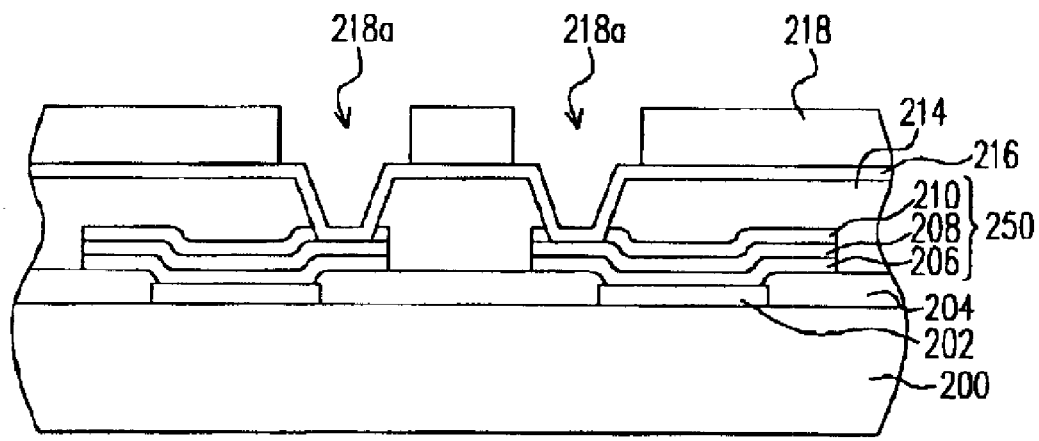
Figure 16:
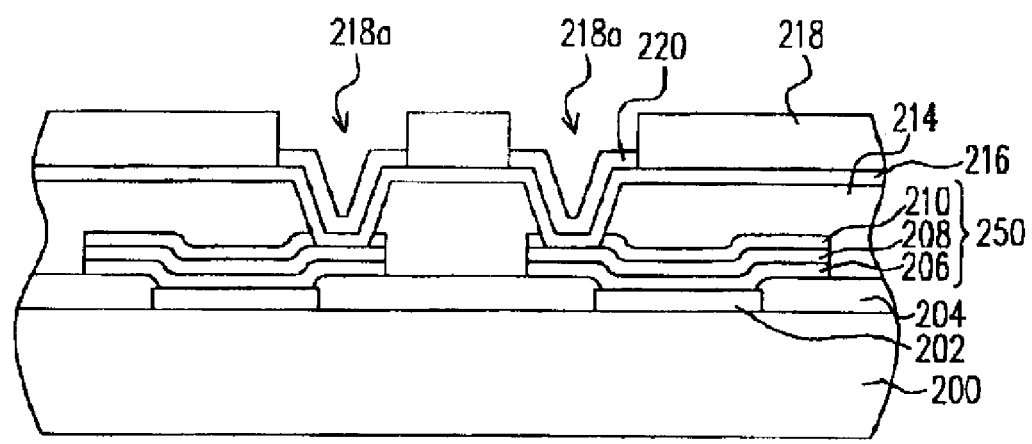

As shown in FIG. 14, a copper layer 216 is formed, over the surface of the patterned benzocyclobutene layer 214. A patterned photoresist layer 218 is then formed over the surface of the copper layer 216 using photolithography as shown in FIG. 15. The patterned photoresist layer 218 comprises a plurality of openings 218a that expose the copper layer 216. As illustrated in FIG. 16, a plurality of copper patterns 220 is formed by electroplating the surface of the exposed copper layer 216.

Figure 17:
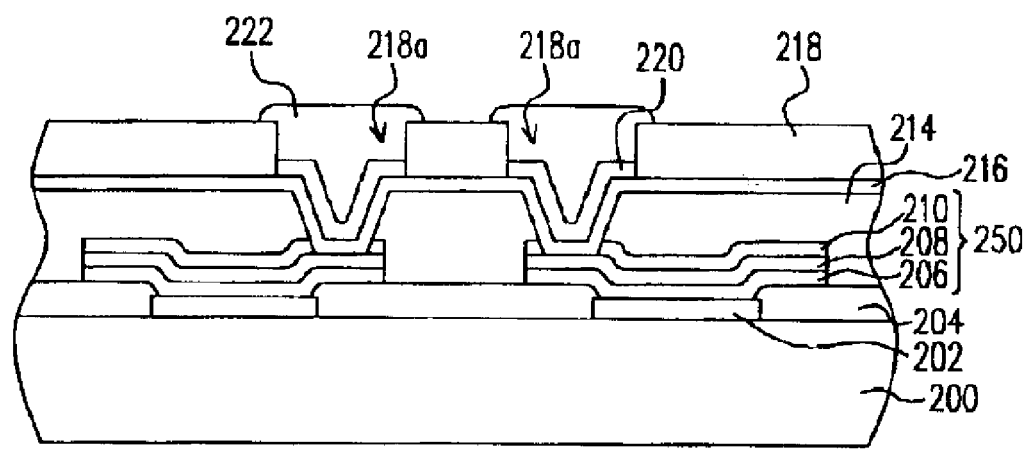
Figure 18:
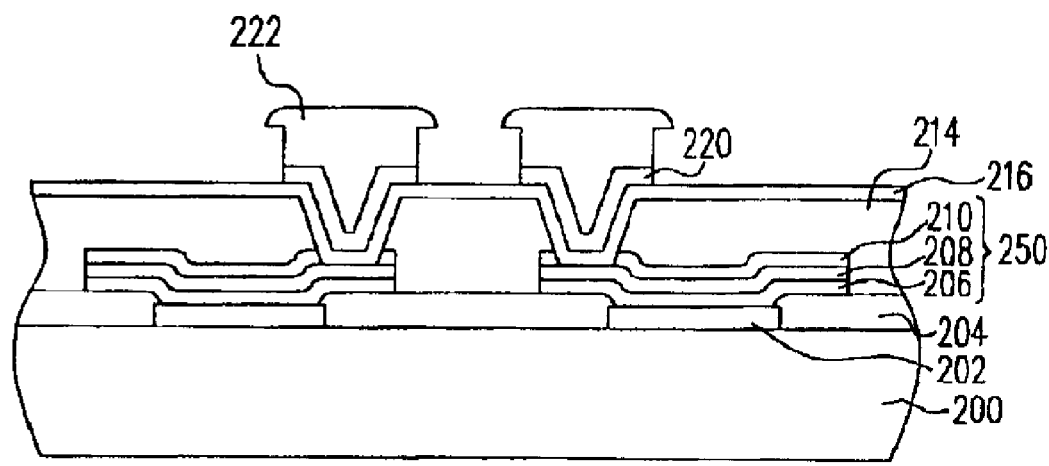

Continuing to FIG. 17, using a printing method or a solder plating method, a solder material fills the openings 218a, over the surface of the copper pattern 220 to form a plurality of solder material layer 222. Thereafter, the patterned photoresist layer 218 is removed as in FIG. 18. Further using the solder material layer 222 as a mask, the copper layer 216 not covered by the copper pattern 220 is removed as shown in FIG. 19. Thereafter, as in FIG. 20, a solder reflow process is performed to form the bump 222a from each solder material layer 222.

In accordance to the present invention, before forming the patterned benzocyclobutene layer 214 as the dielectric layer, a titanium layer 206, a copper layer 208 and a titanium layer 210 are patterned to form a patterned trace layer 250. Therefore, during the formation of the patterned benzocyclobutene layer as the dielectric layer, the benzocyclobutene layer is bound to the second titanium layer 210. Since the binding between benzocyclobutene and titanium is better than the binding between benzocyclobutene and copper, the patterned trace layer 250 and the benzocyclobutene layer 214 can maintain a better binding than what is usually being observed in the prior art. The yield of the process is effectively increased.

In accordance to the present invention, after forming the patterned benzocyclobutene layer 214, a portion of the titanium layer 210 is removed to expose a portion of the copper layer 208, allowing the copper layer 216 to connect with the copper layer 208 of the patterned trace layer 250. Besides improving the binding property between titanium and benzocyclobutene, a more favorable electrical connection is maintained in the connective traces (because the conductivity of copper is better).

In accordance to this aspect of the present invention, before forming the patterned benzocyclobutene layer in the redistribution process, a titanium layer is formed. Therefore, when the patterned benzocyclobutene layer is formed as the dielectric layer, the patterned benzocyclobutene layer is bound with the titanium layer. Therefore, the binding between the benzocyclobutene layer and the patterned trace layer is improved over the prior art to raise the yield of the process.

Further, according to the redistribution process of the present invention, after forming the patterned benzocyclobutene layer, a titanium layer is further removed to expose a portion of the copper layer, allowing the copper layer to connect with the copper layer of the patterned trace layer. Besides improving the binding between benzocyclobutene and titanium, a desirable conductivity of the connective traces is maintained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A redistribution process, comprising:

providing a wafer having a plurality of bonding pads and a protection layer over a surface of the wafer, wherein the protection layer exposes the bonding pads;

forming sequentially a first titanium layer, a first copper layer and a second titanium layer over the surface of the wafer;

defining the second titanium layer, the first copper layer and the first titanium layer to form a patterned trace layer which is connected to each of the bonding pads and exposes the protection layer;

forming a patterned benzocycloybutene layer over a surface of the patterned trace layer, wherein the patterned benzocyclobutene layer comprises a plurality of first openings that expose the second titanium layer;

removing the exposed second titanium layer to expose the first copper layer; and forming a plurality of contacts, which is disposed over the patterned benzocyclobutene layer and connect with the exposed first copper layer, wherein each contact is connected to each of the bonding pads through the patterned trace layer.

2. The process of claim 1, the protection layer is formed with a material that comprises silicon dioxide.

3. The process of claim 1, the protection layer is formed with a material that comprises silicon nitride.

4. The process of claim 1, wherein the patterned benzocyclobutene layer is formed by photolithography.

5. The process of claim 1, wherein defining the second titnaium layer, the first copper layer and the first titanium layer further comprises:

forming a patterned photoresist layer over a surface of the second titanium layer, wherein the patterned photoresist layer comprises a plurality of second openings and the second openings expose the second titanium layer;

removing the exposed second titanium layer, the first copper layer and the first titanium layer; and removing the patterned photoresist layer.

6. The process of claim 5, wherein the patterned photoresist layer is formed by photolithography.

7. The process of claim 1, wherein forming the contacts comprises forming bumps, and the bumps are formed by a method that comprises:

forming a second copper layer over a surface of the patterned benzocyclobutene layer;

forming a patterned photoresist layer over a surface of the second copper layer, wherein the patterned photoresist layer comprises a plurality of third openings, and the third openings expose the second copper layer;

electroplating a copper material on the surface of the exposed second copper layer to form a plurality of copper layer pattern;

filling a solder material in the third openings over a surface of the copper layer pattern to form a plurality of solder layer patterns;

removing the patterned photoresist layer;

removing the uncovered copper layer pattern to expose the second copper; and performing a solder reflow process to form the bumps from the solder layer patterns.

8. The process of claim 1, wherein filling the solder material includes performing electroplating.

9. The process of claim 1, wherein filling the solder material comprises performing printing.

10. The process of claim 1, wherein patterning the photoresist layer includes performing photolithography.

\* \* \* \* \*